United States Patent
Hsu et al.

(10) Patent No.: US 9,048,249 B2
(45) Date of Patent: Jun. 2, 2015

(54) INTEGRATED CIRCUIT CHIP WITH HIGH SPEED INPUT AND OUTPUT PINS DIRECTLY COUPLED TO COMMON NODE

(71) Applicant: Novatek Microelectronics Corp., Hsinchu (TW)

(72) Inventors: Chia-Lun Hsu, Hsinchu (TW); Wing-Kai Tang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/942,714

(22) Filed: Jul. 16, 2013

(65) Prior Publication Data
US 2014/0218102 A1    Aug. 7, 2014

(30) Foreign Application Priority Data
Feb. 5, 2013    (TW) .............................. 102104458 U

(51) Int. Cl.
*H01L 23/48* (2006.01)
*H01L 23/66* (2006.01)

(52) U.S. Cl.
CPC ......... *H01L 23/66* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 7,567,231 B2 * | 7/2009 | Takahashi et al. | 345/100 |
| 8,461,670 B2 * | 6/2013 | Celaya et al. | 257/676 |
| 2003/0095014 A1 | 5/2003 | Lao et al. | |
| 2006/0072740 A1 * | 4/2006 | Tesu et al. | 379/399.01 |
| 2011/0215863 A1 * | 9/2011 | Pan et al. | 327/564 |
| 2014/0015596 A1 * | 1/2014 | Martin et al. | 327/517 |

FOREIGN PATENT DOCUMENTS

| | | |
|---|---|---|
| CN | 1659810 | 8/2005 |
| TW | 412858 | 11/2000 |

OTHER PUBLICATIONS

"Office Action of Taiwan Counterpart Application", issued on Feb. 12, 2015, p. 1-4.

* cited by examiner

*Primary Examiner* — Lincoln Donovan
*Assistant Examiner* — Terry L Englund
(74) *Attorney, Agent, or Firm* — Jianq Chyun IP Office

(57) ABSTRACT

An integrated circuit (IC) including a high-speed signal input pin, a common node, a high-speed signal output pin, and a core circuit is provided. The high-speed signal input pin and the high-speed signal output pin are disposed on a package of the IC. The common node and the core circuit are disposed in the IC. The common node is directly and electrically coupled to the high-speed signal input pin. The high-speed signal output pin is directly and electrically coupled to the common node. A high-speed signal input terminal of the core circuit is directly and electrically coupled to the common node.

10 Claims, 4 Drawing Sheets

INTEGRATED CIRCUIT CHIP WITH HIGH SPEED INPUT AND OUTPUT PINS DIRECTLY COUPLED TO COMMON NODE

CROSS-REFERENCE TO RELATED APPLICATION

This application claims the priority benefit of Taiwan application serial no. 102104458, filed on Feb. 5, 2013. The entirety of the above-mentioned patent application is hereby incorporated by reference herein and made a part of this specification.

BACKGROUND OF THE INVENTION

1. Field of the Invention

The present invention generally relates to an integrated circuit (IC), and more particularly, to an IC with a high-speed signal.

2. Description of Related Art

Different integrated circuits (IC) are usually disposed on a circuit board. These ICs may need to be coupled to the same high-speed bus on the circuit board to receive the same high-speed signal. Herein the high-speed signal may be a mobile industry processor interface (MIPI) signal, a low voltage differential signal (LVDS), or any other high-speed signal.

Each of aforementioned conventional ICs is electrically and directly coupled to the same high-speed bus. However, the transmission efficiency and transmission speed of the high-speed signal are affected by the capacitances on pins of the ICs, the impedances of signal lines between the pins and the high-speed bus, and the compatibility between terminal resistors of the high-speed bus.

SUMMARY OF THE INVENTION

Accordingly, the present invention is directed to an integrated circuit (IC) in which the length of a signal line between the IC and a high-speed bus on a circuit board is shortened.

The present invention provides an IC including a first high-speed signal input pin, a first common node, a first high-speed signal output pin, and a core circuit. The first high-speed signal input pin is disposed on a package of the IC. The first common node is disposed in the IC. The first common node is directly and electrically coupled to the first high-speed signal input pin. The first high-speed signal output pin is disposed on the package. The first high-speed signal output pin is directly and electrically coupled to the first common node. The core circuit is disposed in the IC. A first high-speed signal input terminal of the core circuit is directly and electrically coupled to the first common node.

According to an embodiment of the invention, the IC further includes a second high-speed signal input pin, a second common node, and a second high-speed signal output pin. The second high-speed signal input pin is disposed on the package. The first high-speed signal input pin and the second high-speed signal input pin are differential to each other. The second common node is disposed in the IC. The second common node is directly and electrically coupled to the second high-speed signal input pin. The second high-speed signal output pin is disposed on the package. The second high-speed signal output pin is directly and electrically coupled to the second common node. The first high-speed signal output pin and the second high-speed signal output pin are differential to each other. A second high-speed signal input terminal of the core circuit is directly and electrically coupled to the second common node.

As described above, in embodiments of the present invention, the signal line between an IC and a high-speed bus on a circuit board is embedded into the IC, so that the length of the signal line between the IC and the high-speed bus on the circuit board is shortened.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
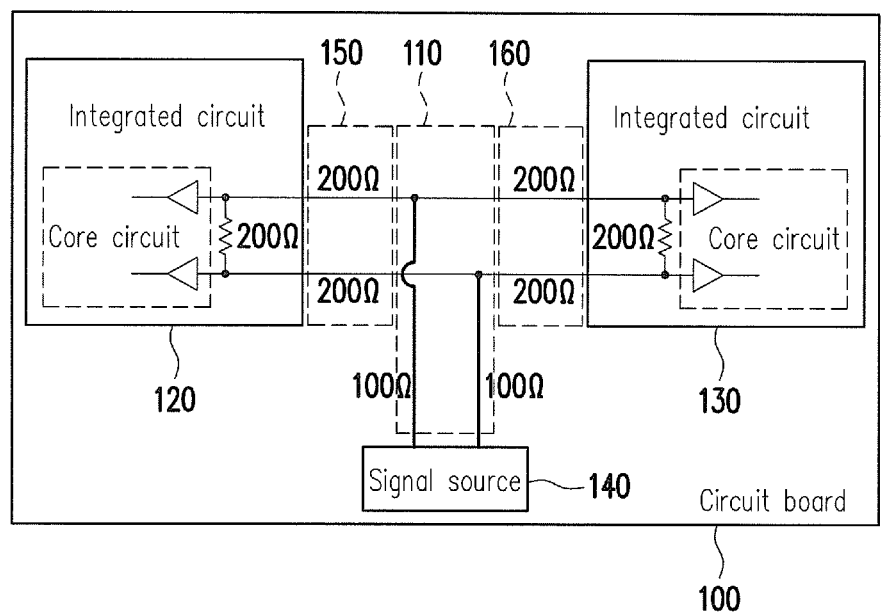
FIG. 1 is a diagram illustrating an example of connections between multiple integrated circuits (ICs) and a single high-speed bus on a circuit board.

The term "couple" used throughout the present disclosure (including the claimed portion) refers to any direct or indirect connection. For example, if a first device is described in the present disclosure as being coupled to a second device, the first device can be directly connected to the second device, or the first device can also be indirectly connected to the second device through other devices or any special connection technique. Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram illustrating an example of connections between multiple integrated circuits (ICs) and a single differential bus line 110 on a circuit board 100. The circuit board 100 can be any type of circuit board, such as a printed circuit board (PCB) or a flexible circuit board. The IC 120 and the IC 130 disposed on the circuit board 100 are both coupled to the same differential bus line 110 for receiving a high-speed signal from the signal source 140. The high-speed signal may be a mobile industry processor interface (MIPI) signal, a low voltage differential signal (LVDS), or any other high-speed signal.

Herein it is assumed that two ICs are serially connected to receive a MIPI signal, as shown in FIG. 1. The IC 120 and the IC 130 are both coupled to the differential bus line 110 respectively through the signal line 150 and the signal line 160. Besides, a terminal resistor is disposed in each of the IC 120 and IC 130. Ideally, the equivalent impedance of the signal lines 150 and 160 between the differential bus line 110 and the ICs should be multiplied by the number of the ICs, and the resistance of the terminal resistors should also be multiplied by the number of the ICs, so that impedance matching can be achieved and the signal transmission efficiency and signal transmission speed can be optimized. For example, as shown in FIG. 1, two ICs are connected to the differential bus line 110. Accordingly, if the impedance of the differential bus line 110 is 100Ω, the impedances of the signal lines 150 and 160 is then 200Ω, and the resistance of the terminal resistors is also 200Ω.

However, signal transmission may be affected by capacitances on the pins of each IC and mismatching between signal lines and terminal resistors. Besides, the multiplication of the equivalent impedance of the signal lines 150 and 160 and the multiplication of the resistance of the terminal resistors may make an even bigger impact on the signal transmission and interfere the transmission of high-speed signals. The connection pattern illustrated in FIG. 1 requires a large layout area and a great number of layers therefore makes the design of a circuit board very difficult.

Figure 2:
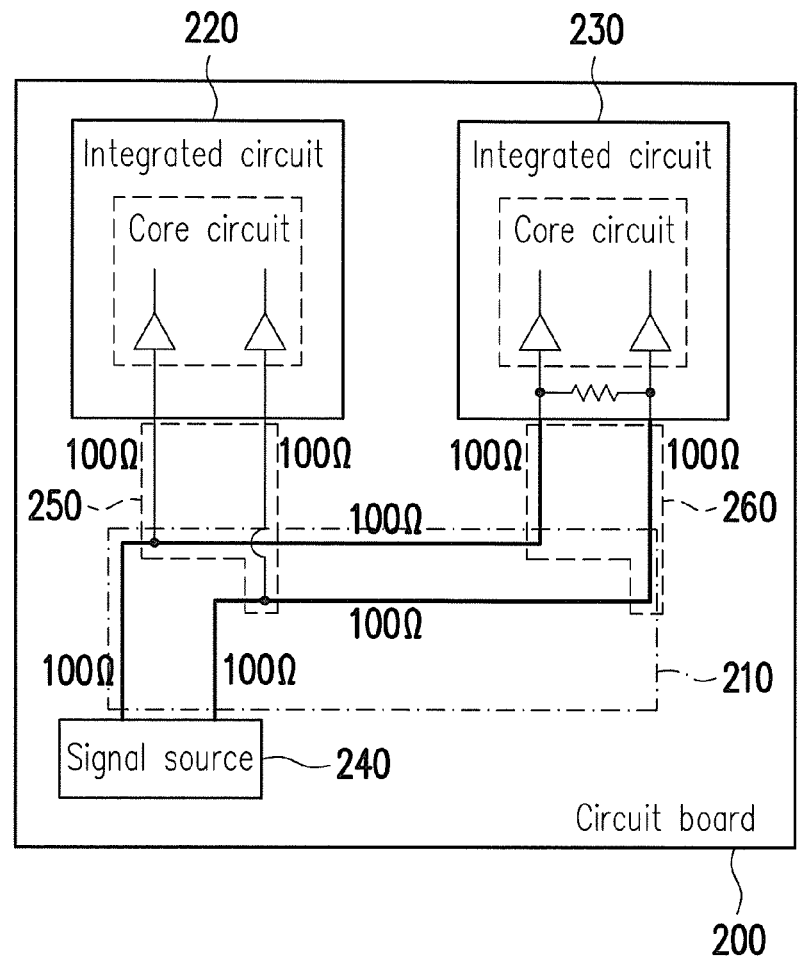
FIG. 2 is a diagram illustrating another example of connections between multiple ICs and a single high-speed bus on a circuit board.

FIG. 2 is a diagram illustrating an example of connections between multiple ICs and a differential bus line 210 on a circuit board 200. The circuit board 200 can be any type of circuit board, such as a PCB or a flexible circuit board. The IC 220 and the IC 230 disposed on the circuit board 200 are both coupled to the same differential bus line 210 for receiving a high-speed signal from the signal source 240. The high-speed signal may be a MIPI signal, a LVDS, or any other high-speed signal.

Herein it is assumed that two ICs are serially connected to receive a MIPI signal, as shown in FIG. 2. The IC 220 and the IC 230 are both coupled to the differential bus line 210 respectively through the signal line 250 and the signal line 260. Because the IC 230 is disposed at the end of the differential bus line 210, a terminal resistor is disposed in the IC 230, while no terminal resistor is disposed in the IC 220. To eliminate the impact of any other factor, in the present embodiment, the equivalent impedance of the signal line 250 between the differential bus line 210 and the IC 220 is designed to be equal to that of the signal line 260 between the differential bus line 210 and the IC 230. Assuming that the impedance of the differential bus line 210 is 100Ω, the impedance of the signal lines 250 and 260 is then 100Ω, and the resistance of the terminal resistor disposed in the IC 230 is also 100Ω. However, impedance mismatching may exist between different connection nodes of different ICs. For example, the longer the signal line 250 is, the more the transmission of a high-speed signal is affected. Thus, when the layout of the circuit board 200 is designed, the signal line 250 should be shortened as much as possible in order to achieve matching impedance.

Figure 3:
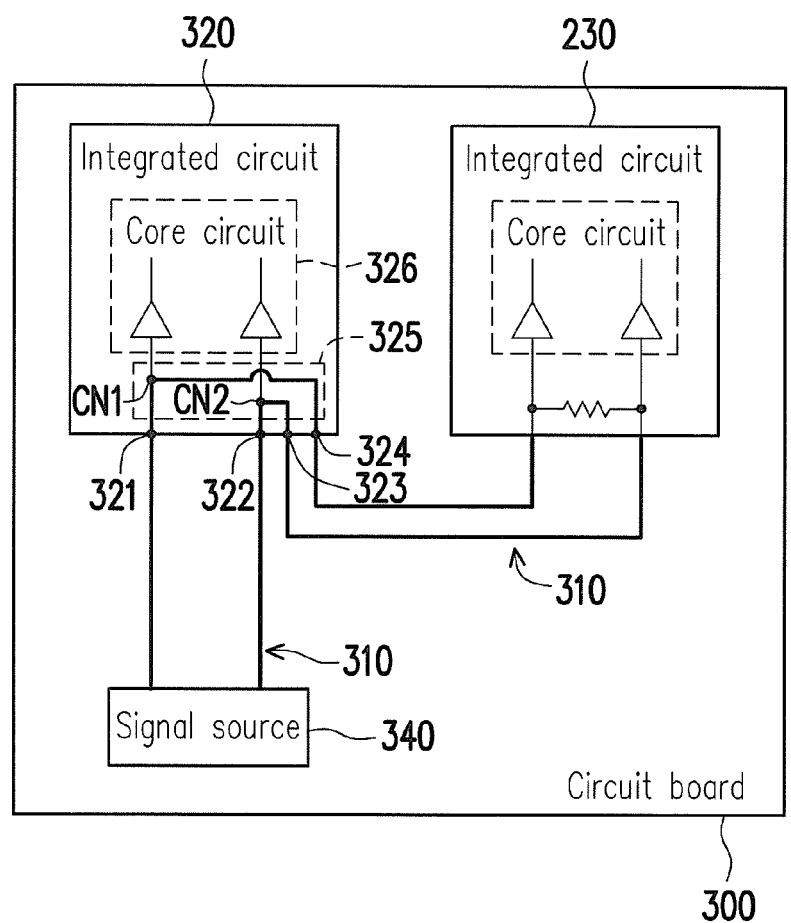
FIG. 3 is a diagram illustrating an application scenario of an IC according to an embodiment of the present invention.

FIG. 3 is a diagram illustrating an application scenario of an IC according to an embodiment of the present invention. The circuit board 300 can be any type of circuit board, such as a PCB or a flexible circuit board. The IC 320 and the IC 230 disposed on the circuit board 300 are both coupled to the same differential bus line 310 (illustrated in FIG. 3 as bold differential pairs) for receiving a high-speed (high-frequency) differential signal from the signal source 340. The high-speed differential signal may be a MIPI signal, a LVDS, or any other differential signal. The embodiment illustrated in FIG. 3 can be understood by referring to the description related to FIG. 2. Unlike that in the embodiment illustrated in FIG. 2, in the embodiment illustrated in FIG. 3, the signal line between the IC 320 and the differential bus line 310 on the circuit board 300 is embedded into the IC 320. Thus, in the embodiment illustrated in FIG. 3, the signal line between the IC 320 and the differential bus line 310 can be shortened as much as possible.

Referring to FIG. 3, the IC 320 includes a first high-speed signal input pin 321, a second high-speed signal input pin 322, a first high-speed signal output pin 324, a second high-speed signal output pin 323, an impedance control circuit 325, and a core circuit 326. The impedance control circuit 325 and the core circuit 326 are disposed in the IC 320. The first high-speed signal input pin 321, the second high-speed signal input pin 322, the first high-speed signal output pin 324, and the second high-speed signal output pin 323 are disposed on the package of the IC 320 so as to be welded onto the circuit board 300. The first high-speed signal input pin 321 and the second high-speed signal input pin 322 are differential to each other, and the first high-speed signal output pin 324 and the second high-speed signal output pin 323 are differential to each other.

The impedance control circuit 325 includes a first common node CN1 and a second common node CN2. The first high-speed signal input pin 321 and the first high-speed signal output pin 324 are both directly and electrically coupled to the first common node CN1. The second high-speed signal input pin 322 and the second high-speed signal output pin 323 are both directly and electrically coupled to the second common node CN2. The differential bus line 310 between the signal source 340 and the IC 320 is coupled to the first high-speed signal input pin 321 and the second high-speed signal input pin 322. The differential bus line 310 between the IC 320 and the IC 230 is coupled to the first high-speed signal output pin 324 and the second high-speed signal output pin 323. Namely, part of the differential bus line 310 on the circuit board 300 is embedded into the impedance control circuit 325 of the IC 320. A single signal line (i.e., the differential bus line 310) possesses both input pins (i.e., the high-speed signal input pins 321 and 322) and output pins (i.e., the high-speed signal output pins 323 and 324) on the same IC 320. The signal source 340 outside the IC 320 can transmit a first-end signal of the high-speed (high-frequency) differential signal to other ICs (for example, the IC 230) through the first high-speed signal input pin 321, the first common node CN1, and the first high-speed signal output pin 324, and the signal source 340 can transmit a second-end signal of the high-speed (high-frequency) differential signal to aforementioned IC 230 through the second high-speed signal input pin 322, the second common node CN2, and the second high-speed signal output pin 323.

The first high-speed signal input terminal of the core circuit 326 is directly and electrically coupled to the first common node CN1. The second high-speed signal input terminal of the core circuit 326 is directly and electrically coupled to the second common node CN2. In the present embodiment, the core circuit 326 includes a first input buffer and a second input buffer. The input terminal of the first input buffer is coupled to the first high-speed signal input terminal of the core circuit 326, and the input terminal of the second input buffer is coupled to the second high-speed signal input terminal of the core circuit 326. Thus, the core circuit 326 can receive the high-speed (high-frequency) differential signal from the differential bus line 310 through the first high-speed signal input pin 321 and the second high-speed signal input pin 322. In addition, because the signal line between the IC 320 and the differential bus line 310 (i.e., the signal line between the core circuit 326 and the common nodes CN1 and CN2) is embedded in the IC 320, the signal line between the IC 320 and the differential bus line 310 can be shortened as much as possible to achieve matching impedance.

When the layout of an IC is designed, the designer can realize impedance control by adjusting design parameters of the impedance control circuit 325, so as to optimize the impedance matching capability and improve the transmission efficiency of high-speed (high-frequency) signals. If the first high-speed signal line between the first high-speed signal input pin 321 and the first common node CN1 is disposed on the $n^{th}$ conductive layer, the distance between the $n^{th}$ conductive layer and the $(n+1)^{th}$ conductive layer is H, the distance between the $n^{th}$ conductive layer and the $(n-1)^{th}$ conductive layer is $H_1$, the width of the first high-speed signal line is W, the height of the first high-speed signal line is T, and the dielectric coefficient of the IC 320 is $\in_r$, the characteristic impedance $Z_0$ of the first high-speed signal line is then $$Z_0 = \frac{80}{\sqrt{\varepsilon_r}} \text{Ln}\left[\frac{1.9(2H+T)}{0.8W+T}\right]\left(1 - \frac{H}{4H_1}\right).$$

Other signal lines (for example, the second high-speed signal line between the second high-speed signal input pin 322 and the second common node CN2) of the impedance control circuit 325 can be referred to related description of the first high-speed signal line. If the characteristic impedances of the first high-speed signal line (i.e., the signal line between the first high-speed signal input pin 321 and the first common node CN1) and the second high-speed signal line (i.e., the signal line between the second high-speed signal input pin 322 and the second common node CN2) are both $Z_0$, the first high-speed signal line and the second high-speed signal line are both disposed on the $n^{th}$ conductive layer, the distance between the $(n-1)^{th}$ conductive layer and the $(n+1)^{th}$ conductive layer is $H_2$, and the distance between the first high-speed signal line and the second high-speed signal line is S, the differential characteristic impedance $Z_{diff}$ between the first high-speed signal line and the second high-speed signal line is then $$Z_{diff} = 2 \times Z_0 \times \left(1 - 0.347 \times e^{-2.9 \times \frac{S}{H_2}}\right).$$

Based on different thickness and material of the IC, the designer can adjust the width W, the height T, and/or the distance S of the signal line to match the impedance of the differential bus line 310 outside the IC, so as to achieve the optimal transmission efficiency of the high-speed (high-frequency) signal.

Figure 4:
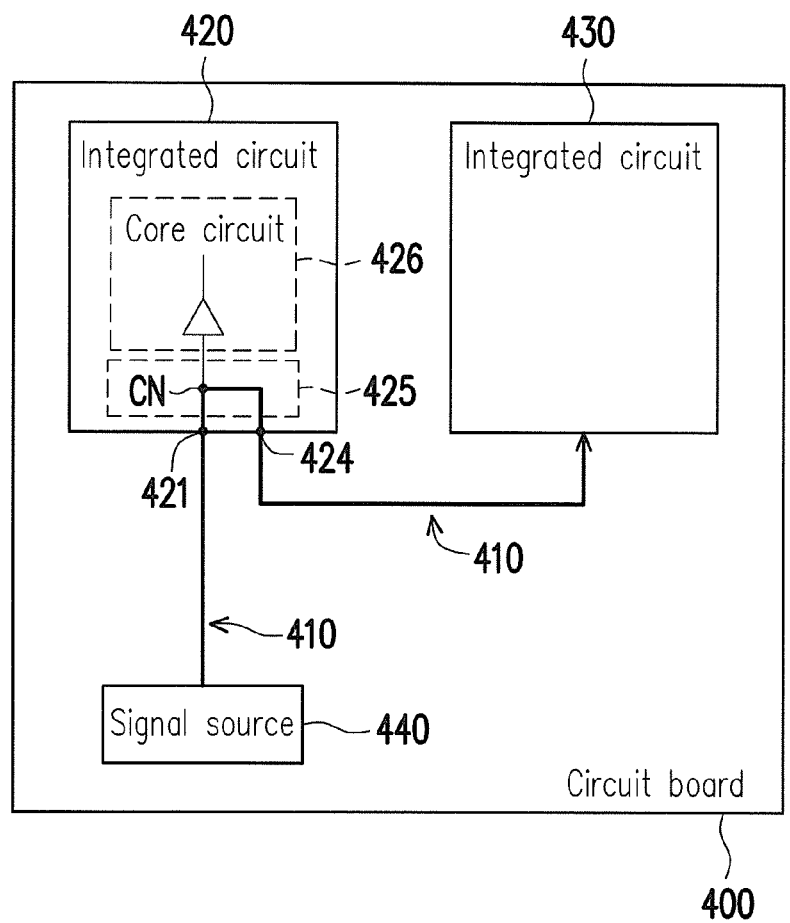
FIG. 4 is a diagram illustrating an application scenario of an IC according to another embodiment of the present invention.

FIG. 4 is a diagram illustrating an application scenario of an IC according to another embodiment of the present invention. The circuit board 400 can be any type of circuit board, such as a PCB or a flexible circuit board. The IC 420 and the IC 430 disposed on the circuit board 400 are both coupled to the same bus line 410 (illustrated in FIG. 4 as bold differential pairs) for receiving a high-speed (high-frequency) signal from the signal source 440. The embodiment illustrated in FIG. 4 can be referred to the descriptions related to FIG. 2 and FIG. 3. Unlike that in the embodiment illustrated in FIG. 3, in the embodiment illustrated in FIG. 4, the bus line 410 transmits a single-end signal instead of a differential signal.

Referring to FIG. 4, the IC 420 includes a high-speed signal input pin 421, a high-speed signal output pin 424, an impedance control circuit 425, and a core circuit 426. The impedance control circuit 425 and the core circuit 426 are disposed in the IC 420. The high-speed signal input pin 421 and the high-speed signal output pin 424 are disposed on the package of the IC 420 to be welded onto the circuit board 400.

The impedance control circuit 425 includes a common node CN. The high-speed signal input pin 421 and the high-speed signal output pin 424 are both directly and electrically coupled to the common node CN. The bus line 410 between the signal source 440 and the IC 420 is coupled to the high-speed signal input pin 421. The bus line 410 between the IC 420 and the IC 430 is coupled to the high-speed signal output pin 424. Namely, part of the bus line 410 on the circuit board 400 is embedded into the impedance control circuit 425 of the IC 420. A single bus line 410 possesses both an input pin 421 and an output pin 424 on the same IC 420. The signal source 440 outside the IC 420 can transmit a high-speed (high-frequency) signal to other ICs (for example, the IC 430) through the high-speed signal input pin 421, the common node CN, and the high-speed signal output pin 424.

The high-speed signal input terminal of the core circuit 426 is directly and electrically coupled to the common node CN. In the present embodiment, the core circuit 426 includes an input buffer. The input terminal of the input buffer is coupled to the high-speed signal input terminal of the core circuit 426. Thus, the core circuit 426 can receive a high-speed (high-frequency) signal from the bus line 410 through the high-speed signal input pin 421. In addition, because the signal line between the IC 420 and the bus line 410 (i.e., the signal line between the core circuit 426 and the common node CN) is embedded in the IC 420, the signal line between the IC 420 and the bus line 410 can be shortened as much as possible to achieve matching impedance.

When the layout of an IC is designed, the designer can realize impedance control by adjusting design parameters of the impedance control circuit 425, so as to optimize the impedance matching capability and improve the transmission efficiency of high-speed (high-frequency) signals. If the high-speed signal line between the high-speed signal input pin 421 and the common node CN is disposed on the $n^{th}$ conductive layer, the distance between the $n^{th}$ conductive layer and the $(n+1)^{th}$ conductive layer is H, the distance between the $n^{th}$ conductive layer and the $(n-1)^{th}$ conductive layer is $H_1$, the width of the high-speed signal line is W, the height of the high-speed signal line is T, and the dielectric coefficient of the IC 420 is $\in_r$, the characteristic impedance $Z_0$ of the high-speed signal line is then $$Z_0 = \frac{80}{\sqrt{\varepsilon_r}} \text{Ln}\left[\frac{1.9(2H+T)}{0.8W+T}\right]\left(1 - \frac{H}{4H_1}\right).$$

Based on different thickness and material of the IC, the designer can adjust the width W and/or the height T of the signal line to match the impedance of the bus line 410 outside the IC, so as to achieve the optimal transmission efficiency of the high-speed (high-frequency) signal.

As described above, in embodiments of the present invention, the signal line between an IC and a high-speed bus on a circuit board is embedded into the IC, so that the length of the signal line between the IC and the high-speed bus on the circuit board can be shortened as much as possible. Thereby, the layout of the IC in each of aforementioned embodiments can be designed to shorten the signal line of a high-speed bus as much as possible, and accordingly the transmission path of a high-speed (high-frequency) signal can fulfill the optimal impedance matching.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated circuit (IC) chip, comprising:
   a first high-speed signal input pin, disposed on a package of the IC chip;
   a first common node, disposed in the IC chip, and directly and electrically coupled to the first high-speed signal input pin;
   a first high-speed signal output pin, disposed on the package, and directly and electrically coupled to the first common node; and
   a core circuit, disposed in the IC chip, wherein a first high-speed signal input terminal of the core circuit is directly and electrically coupled to the first common node.

2. The IC chip according to claim 1, wherein the core circuit comprises:
   a first input buffer, wherein an input terminal of the first input buffer is coupled to the first high-speed signal input terminal of the core circuit.

3. The IC chip according to claim 1, wherein the core circuit receives a high-speed signal from a bus line on a circuit board through the first high-speed signal input pin.

4. The IC chip according to claim 1, wherein a signal source outside the IC chip transmits a high-speed signal to other ICs through the first high-speed signal input pin, the first common node and the first high-speed signal output pin.

5. The IC chip according to claim 1, wherein when a first high-speed signal line between the first high-speed signal input pin and the first common node is disposed on an $n^{th}$ conductive layer, a distance between the $n^{th}$ conductive layer and a $(n+1)^{th}$ conductive layer is H, a distance between the $n^{th}$ conductive layer and a $(n-1)^{th}$ conductive layer is $H_1$, a width of the first high-speed signal line is W, a height of the first high-speed signal line is T, and a dielectric coefficient of the IC chip is $\epsilon_r$, a characteristic impedance $Z_0$ of the first high-speed signal line is $$Z_0 = \frac{80}{\sqrt{\epsilon_r}} \text{Ln}\left[\frac{1.9(2H+T)}{0.8W+T}\right]\left(1 - \frac{H}{4H_1}\right).$$

6. The IC chip according to claim 1 further comprising:
   a second high-speed signal input pin, disposed on the package, wherein the first high-speed signal input pin and the second high-speed signal input pin are differential pair;
   a second common node, disposed in the IC chip, and directly and electrically coupled to the second high-speed signal input pin; and
   a second high-speed signal output pin, disposed on the package, and directly and electrically coupled to the second common node, wherein the first high-speed signal output pin and the second high-speed signal output pin are differential pair;
   wherein a second high-speed signal input terminal of the core circuit is directly and electrically coupled to the second common node.

7. The IC chip according to claim 6, wherein the core circuit comprises:
   a first input buffer, wherein an input terminal of the first input buffer is coupled to the first high-speed signal input terminal of the core circuit; and
   a second input buffer, wherein an input terminal of the second input buffer is coupled to the second high-speed signal input terminal of the core circuit.

8. The IC chip according to claim 6, wherein the core circuit receives a high-speed differential signal from a differential bus line on a circuit board through the first high-speed signal input pin and the second high-speed signal input pin.

9. The IC chip according to claim 6, wherein a signal source outside the IC chip transmits a first-end signal of a high-speed differential signal to other ICs through the first high-speed signal input pin, the first common node and the first high-speed signal output pin, and the signal source transmits a second-end signal of the high-speed differential signal to the other ICs through the second high-speed signal input pin, the second common node and the second high-speed signal output pin.

10. The IC chip according to claim 6, wherein when a first high-speed signal line between the first high-speed signal input pin and the first common node and a second high-speed signal line between the second high-speed signal input pin and the second common node are both disposed on an $n^{th}$ conductive layer, a distance between a $(n-1)^{th}$ conductive layer and a $(n+1)^{th}$ conductive layer is $H_2$, a characteristic impedance of the first high-speed signal line and the second high-speed signal line is $Z_0$, and a distance between the first high-speed signal line and the second high-speed signal line is S, a differential characteristic impedance $Z_{diff}$ of the first high-speed signal line and the second high-speed signal line is $$Z_{diff} = 2 \times Z_0 \times \left(1 - 0.347 \times e^{-2.9 \times \frac{S}{H_2}}\right).$$

* * * * *